United States Patent
Miller

(10) Patent No.: US 7,863,915 B2
(45) Date of Patent: Jan. 4, 2011

(54) PROBE CARD COOLING ASSEMBLY WITH DIRECT COOLING OF ACTIVE ELECTRONIC COMPONENTS

(75) Inventor: Charles A. Miller, Fremont, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 12/547,260

(22) Filed: Aug. 25, 2009

(65) Prior Publication Data

US 2010/0052714 A1 Mar. 4, 2010

Related U.S. Application Data

(62) Division of application No. 11/112,034, filed on Apr. 22, 2005, now Pat. No. 7,579,847, which is a division of application No. 10/026,471, filed on Dec. 27, 2001, now Pat. No. 6,891,385.

(51) Int. Cl.
*G01R 31/02* (2006.01)
(52) U.S. Cl. ...................... 324/754; 324/760
(58) Field of Classification Search ............. 324/158.1, 324/750–758, 760–768; 438/14–17
See application file for complete search history.

(56) References Cited

U.S. PATENT DOCUMENTS

| | | | |
|---|---|---|---|
| 4,000,509 A | 12/1976 | Jarvela | |
| 4,245,273 A | 1/1981 | Feinberg et al. | |
| 4,561,040 A | 12/1985 | Eastman et al. | |
| 4,757,255 A | 7/1988 | Margozzi | |
| 4,778,326 A | 10/1988 | Althouse et al. | |
| 4,820,976 A | 4/1989 | Brown | |
| 4,839,774 A | 6/1989 | Hamburgen | |
| 4,860,444 A | 8/1989 | Herrell et al. | |
| 4,954,774 A | 9/1990 | Binet | |
| 5,021,924 A | 6/1991 | Kieda et al. | |
| 5,054,192 A | 10/1991 | Cray et al. | |
| 5,102,343 A | 4/1992 | Knight et al. | |
| 5,198,752 A | 3/1993 | Miyata et al. | |
| 5,198,753 A | 3/1993 | Hamburgen | |
| 5,476,211 A | 12/1995 | Khandros | |
| 5,550,482 A | 8/1996 | Sano | |

(Continued)

FOREIGN PATENT DOCUMENTS

DE 2938096 4/1981

(Continued)

OTHER PUBLICATIONS

"Colling System For Semiconductor Modules," IBM Technical Disclosure Bulletin, vol. 26, No. 3B (Aug. 1983), p. 1548.

(Continued)

*Primary Examiner*—Minh N Tang
*Assistant Examiner*—Trung Q Nguyen
(74) *Attorney, Agent, or Firm*—Kirton & McConkie

(57) ABSTRACT

A probe card cooling assembly for use in a test system includes a package with one or more dies cooled by direct cooling. The cooled package includes one or more dies with active electronic components and at least one coolant port that allows a coolant to enter the high-density package and directly cool the active electronic components of the dies during a testing operation.

16 Claims, 15 Drawing Sheets

U.S. PATENT DOCUMENTS

| | | | |
|---|---|---|---|
| 5,568,054 A | 10/1996 | Iino et al. |
| 5,650,914 A | 7/1997 | DiStefano et al. |
| 5,690,749 A | 11/1997 | Lee |
| 5,719,444 A | 2/1998 | Tilton et al. |
| 5,834,946 A | 11/1998 | Albrow et al. |
| 5,854,092 A | 12/1998 | Root et al. |
| 5,889,651 A | 3/1999 | Sasaki et al. |
| 5,917,707 A | 6/1999 | Khandros et al. |
| 5,986,447 A | 11/1999 | Hanners et al. |
| 6,012,224 A | 1/2000 | DiStefano et al. |
| 6,031,720 A | 2/2000 | Crane |
| 6,033,935 A | 3/2000 | Dozier, II et al. |
| 6,056,627 A | 5/2000 | Mizuta |
| 6,064,213 A | 5/2000 | Khandros et al. |
| 6,078,500 A | 6/2000 | Beaman et al. |
| 6,085,831 A | 7/2000 | DiGiacomo et al. |
| 6,110,823 A | 8/2000 | Eldridge et al. |
| 6,140,616 A | 10/2000 | Andberg |
| 6,169,409 B1 | 1/2001 | Amemiya |
| 6,184,053 B1 | 2/2001 | Eldridge et al. |
| 6,184,065 B1 | 2/2001 | Smith et al. |
| 6,205,799 B1 | 3/2001 | Patel et al. |
| 6,232,149 B1 | 5/2001 | Dozier, II et al. |
| 6,255,126 B1 | 7/2001 | Mathieu et al. |
| 6,268,015 B1 | 7/2001 | Mathieu et al. |
| 6,313,652 B1 | 11/2001 | Maeng |
| 6,451,709 B1 | 9/2002 | Hembree |
| 6,459,581 B1 | 10/2002 | Newton et al. |
| 6,468,098 B1 | 10/2002 | Eldridge |
| 6,534,586 B2 | 3/2003 | Tsuji et al. |
| 6,534,856 B1 | 3/2003 | Dozier et al. |
| 6,545,493 B1 | 4/2003 | Iino |
| 6,550,263 B2 | 4/2003 | Patel et al. |
| 6,727,580 B1 | 4/2004 | Eldridge et al. |
| 6,825,681 B2 | 11/2004 | Feder et al. |
| 6,838,896 B2 | 1/2005 | Leedy |
| 6,891,385 B2 | 5/2005 | Miller |
| 6,971,793 B2 | 12/2005 | Tsui et al. |
| 6,985,000 B2 | 1/2006 | Feder et al. |
| 7,049,841 B2 | 5/2006 | Yamashita |
| 7,064,953 B2 | 6/2006 | Miller |
| 7,190,184 B2 | 3/2007 | Haji-Sheikh et al. |
| 7,433,188 B2 | 10/2008 | Miller |
| 7,579,847 B2 | 8/2009 | Miller |
| 2002/0004320 A1 | 1/2002 | Pedersen et al. |
| 2002/0172007 A1 | 11/2002 | Pautsch |
| 2006/0274501 A1 | 12/2006 | Miller |
| 2008/0088010 A1 | 4/2008 | Hobbs et al. |
| 2009/0032938 A1 | 2/2009 | Miller |

FOREIGN PATENT DOCUMENTS

| | | |
|---|---|---|
| EP | 0261829 | 3/1988 |
| EP | 0709884 | 5/1996 |
| JP | 403139899 | 6/1991 |
| JP | 10-506197 | 6/1998 |
| JP | 10-223704 | 8/1998 |
| JP | 11-504725 | 4/1999 |
| JP | 2000-28641 | 1/2000 |
| JP | 2001-102418 | 4/2001 |
| TW | 459139 | 10/2001 |
| TW | 468367 | 12/2001 |
| WO | WO 95/14314 | 5/1995 |
| WO | WO 96/15458 | 5/1996 |
| WO | WO 96/17378 | 6/1996 |
| WO | WO 97/43654 | 11/1997 |
| WO | WO 98/52224 | 11/1998 |
| WO | WO 98/53330 | 11/1998 |
| WO | WO 00/33089 | 6/2000 |
| WO | WO 01/13113 | 2/2001 |

OTHER PUBLICATIONS

Advanced Electronic Packaging-With emphasis on Multichip Modules, William D. Brown, (Ed.) "13.5 Competitive Mainframe Packaging Examples," pp. 547-550, IEEE (1999).

Electronic Packaging and Interconnection Handbook, Charles A. Harper (Ed.), "2.7 High Heat-Load Cooling," pp. 2.57-2.66, Third Edition, McGraw-Hill (2000).

PROBE CARD COOLING ASSEMBLY WITH DIRECT COOLING OF ACTIVE ELECTRONIC COMPONENTS

CROSS-REFERENCE TO RELATED APPLICATION(S)

This application is a division of U.S. patent application Ser. No. 11/112,034, filed Apr. 22, 2005 (now U.S. Pat. No. 7,579, 847), which is a division of U.S. patent application Ser. No. 10/026,471, filed Dec. 27, 2001 (now U.S. Pat. No. 6,891, 385). The foregoing U.S. patent application Ser. Nos. 11/112, 034 and 10/026,471 are incorporated herein by reference in their entirety.

BACKGROUND OF THE INVENTION

1. Field of the Invention

The present invention relates to semiconductor manufacturing and testing. The present invention further relates to probe cards that are used to perform test and/or burn-in procedures on semiconductor devices.

2. Related Art

Individual semiconductor (integrated circuit) devices (dies) are typically produced by creating several identical dies on a semiconductor wafer, using known techniques of photolithography, deposition, and the like. Generally, these processes are intended to create a plurality of fully-functional integrated circuit devices, prior to singulating (severing) the individual dies from the semiconductor wafer. In practice, however, certain physical defects in the wafer itself and certain defects in the processing of the wafer inevitably lead to some of the dies being "good" (fully-functional) and some of the dies being "bad" (partially functional or non-functional). It is generally desirable to be able to identify which of the plurality of dies on a wafer are good dies prior to their packaging, and preferably prior to their being singulated from the wafer.

To this end, a wafer test system may advantageously be employed to make a plurality of discrete pressure connections to a like plurality of discrete connection pads (bond or contact pads) on the dies. In this manner, the semiconductor dies can be tested and exercised, prior to singulating the dies from the wafer. A conventional component of a wafer test system is a "probe card assembly" (also called a "probe card") which can include a number of components coupling electrical signals between tester processing circuitry and probe elements. Probe elements have tips which effect pressure connections to respective pads of the semiconductor dies during testing and burn-in.

FIG. 1 is a simplified diagram of a conventional test system 100. Test system 100 includes a chuck 110, wafer 120, devices under test (DUTs) 125, probe elements 130, probe card assembly 140 and tester 150. Chuck 110 supports wafer 120. Chuck 110 is coupled to a control mechanism (not shown) which positions DUTs 125 with respect to probe elements 130 during testing. Wafer 120 includes one or more DUTs 125. For example, DUTs 125 can be a number of semiconductor dies fabricated on wafer 120 which are undergoing testing in a manufacturing process.

Probe card assembly 140 is positioned between wafer 120 and tester 150. Probe card assembly 140 is responsible for coupling signals between probe elements 130 and tester 150. During testing, probe tips 135 on probe elements 130 contact each DUT 125 at pads 126 positioned at predetermined locations. Tester 150 then performs any number of conventional testing routines.

FIG. 2 shows an example probe card assembly 140 in further detail. Probe card assembly 140 includes a space transformer 210, interposer 220, and a printed circuit board (PCB) 230. Interconnection elements 215 couple space transformer 210 and interposer 220. Interconnection elements 225 couple interposer 220 and printed circuit board 230. Note only two interconnection elements 215 and two interconnection elements 225 are shown for clarity, however, many such interconnection elements 215, 225 can be used. Electrical signals at probe elements 130 are carried through space transformer 210 to interconnection elements 215, to interposer 220, to interconnection elements 225, and eventually to PCB 230. PCB 230 then interfaces with a tester 150 as shown in FIG. 1. Similarly, electrical signals including test commands and signal test patterns issued by tester 150 pass through PCB 230, interconnection elements 225, interposer 220, interconnection elements 215, space transformer 210, and eventually to probe elements 130.

As the number of DUTs 125 being tested in parallel increases and the number and pitch of contact pads 126 on each DUT 125 increases, the number of probe elements 130 and their density increases. Space transformer 210 serves as an interface between the relatively dense arrangement of probe elements 130 and the larger and less dense geometry of printed circuit board 230. In particular, space transformer 210 interconnects probe elements 130 and interconnection elements 215. Space transformer 210 primarily includes passive circuit elements such as wires or other electrical conduits for coupling signals from probe elements 130 to a larger spatial geometry of interconnection elements 215. Capacitors are also sometimes used in space transformer 210 to further condition electrical signals passing therethrough. Simple, low power electronic components such as relays are sometimes used to allow separate control of the powering on and off of the testing performed on individual DUTs 125.

Interposer 220 couples signals traveling between interconnection elements 215 and 225. Interposer 220 is optional and is used to further maintain alignment when the position of space transformer 210 is adjusted in a "z" direction perpendicular to the surface of a wafer (e.g., wafer 120). PCB 230 couples signals between interconnection elements 225 and tester 150. PCB 230 can include any type of electronic circuitry that supports testing. For example, PCB 230 often includes an interface unit to couple signals to and from a port on tester 150. PCB 230 can also include circuitry for converting signals sent in a test pattern by tester 150 for a particular number of expected devices under test to the actual number of devices under test in a given process. In this way, if tester 150 is configured to send a test pattern in 64 channels for 64 DUTs and only 32 DUTs are present in a particular process, PCB 230 can include processing circuitry to issue the test pattern on the appropriate 32 channels. Note probe card assembly 140 is illustrative. In general, different types of probe card assemblies exist with different components and configurations. For example, some probe card assemblies do not include an interposer and some probe card assemblies may not include a printed circuit board.

One design goal of probe card assembly 140 is to provide uniform output signals to tester 150. Several factors are increasing the demands made upon probe card assembly 140. First, input/output (I/O) speeds continue to increase. Accordingly, the clock rate at tester 150 continues to increase from a megahertz range to even a gigahertz range. Second, the number and density of probe elements 130 continues to increase with the increasing number of leads (also called pads) on DUTs 125. Further, pad and pitch sizes of DUTs 125 continue to decrease, thereby increasing the density of the contacting probe elements 130. These demands upon probe card assembly 140 make it more difficult to provide uniform output signals. Problems such as pin-to-pin skew, differences in rise time, and other parasitics can occur as electrical signals travel through probe card assembly 140 during testing. Such problems are exacerbated when electrical signals have to travel over an extensive path between probe elements 130 and tester 150.

One approach to handling the increasing demands upon probe card assembly 140 is to incorporate additional hardware in probe card assembly 140 to carry out testing functionality. For example, active electronic components can be mounted on printed circuit board 230. These active electronic components can carry out certain testing functionalities. In this way, the length of the electrical signal path is reduced since certain electrical signals only need to travel from the probe elements 130 to PCB 230 before being processed. This solution can be of somewhat limited benefit, however, since the electrical path between probe elements 130 and PCB 230 may still be too great to sufficiently reduce parasitics. Accordingly, it is desirable to position active electronic components which can support testing functionality even closer to probe elements 130. Moving active electronic components close to probe elements 130, however, results in design problems heretofore not faced in probe card assemblies. In particular, the dense packing arrangement of probe elements 130 would require that the active electronic components be packed densely as well. Among other things, this leads to a heating problem not encountered before in probe card assemblies.

Heating problems have been recognized with respect to wafers. Different test systems have provided cooling mechanisms for wafers. The cooling mechanisms are provided both to control temperature and to maintain even heating across a wafer. For example, in certain testing and burn-in applications a particular temperature condition must be maintained. See also, U.S. Pat. No. 5,198,752, issued to Miyata et al. and U.S. Pat. No. 6,140,616, issued to Andberg.

SUMMARY OF THE INVENTION

The present invention provides a probe card cooling assembly. The probe card cooling assembly includes a cooling system, coolant circulation system, and a cooled package. The cooled package includes one or more dies. Each die is directly cooled on one or more sides by a coolant present within the cooled package. In this way, heat generated by active electronic components on one or more surfaces of a die is transferred away from the active electronic components. Such direct cooling of die surfaces in a probe card assembly according to the present invention minimizes temperature variation across each die and reduces electrical parameter variation; hence, the uniformity of output test signal characteristics such as rise time and pin-to-pin skew is improved. Hot spots on a die surface are reduced or eliminated, allowing the operating temperature range of a die to be increased.

In one embodiment, the cooled package includes a housing that encloses a cavity. The housing has at least one coolant port that allows a coolant to circulate within the cavity. Each die is mounted on a substrate within an enclosed and sealed cavity in which coolant is circulated. In one example, one die is mounted within the cavity of the housing. In another example, a plurality of dies are mounted within the cavity of the housing. In another example, a high-density cooled package is provided in which an array of densely packed dies are arranged within the cavity of the housing. A high-density cooled package in a probe card assembly is further advantageous for some embodiments in that additional electronic components supporting testing operations can be positioned compactly at or near probe elements. In one preferred example, a high-density cooled package includes an array of densely packed dies mounted such that die surfaces with active electronic components face a substrate within the cavity of the housing.

In one example, a housing of a cooled package includes top and bottom substrates coupled by a seal. A cooling system is coupled to a coolant circulation system to provide liquid and/or gas coolant into and out of one or more coolant ports in the housing. In one arrangement, the housing includes two coolant ports. For example, two ports such as one-way flow valves can be provided in an O-ring seal coupling the top and bottom substrates. One port passes coolant into the cavity and the other port passes coolant out of the cavity. In this way, heat is transferred directly away from the active surfaces of the dies.

According to a further feature, one or more dies include compliant interconnects coupled to at least one substrate. Such compliant interconnects allow coolant to circulate around all surfaces of the dies within the cavity while maintaining effective structural and electrical contact between each die and the substrate. In preferred embodiments of the present invention, the compliant interconnects are spring contacts which couple a die to a bottom substrate. Dies can be soldered to the spring contacts or held by frictional contact with the aid of alignment posts in a socket configuration. The spring contacts provide a flexible, resilient stand-off that allows liquid or gas coolant to run between the substrate and one or more sides of each die, including direct contact with the active surface of the die to provide uniform cooling even for high-power applications. Such spring contacts allow coolant circulation and heat transfer away from active surfaces of dies even in embodiments of the present invention involving one or more dies which are mounted to face a substrate within the cavity of a housing.

According to a further feature, non-contacting compliant interconnects are also provided on a die surface. A non-contacting compliant interconnect can be any type of compliant interconnect such as a spring. These non-contacting compliant interconnects do not contact a substrate, but serve to direct heat away from areas of the die surface. This further improves cooling of die(s) in a cooled package according to the present invention.

In one embodiment, a cooled package includes one or more dies mounted in a stacked die arrangement. In this arrangement, one or more dies are flip-chip bonded to a top substrate. The top substrate is then coupled by compliant interconnects to a bottom substrate.

In one embodiment of a cooled package according to the present invention, electrical connections between one or more dies and external components are made through output contacts at a peripheral edge of the bottom substrate. In another embodiment, electrical connections between one or more dies and external components are made through output contacts at a top substrate. According to a further feature, additional electrical connections can run through a cooled package directly between the top and bottom substrates.

An advantage of the present invention is that embodiments of the present invention can include a probe card cooling assembly for use in a test system which position a direct cooled package at or near probe elements. One or more dies can then carry out high-power applications such as testing operations at or near probe elements. Additional active electronic components can be included in one or more dies at or near probe elements without reaching an overheating condition that degrades testing signal quality to an unacceptable level. Placing the active electronic components at or near the probe elements rather than at a more remote tester also reduces the conduction path of signals and further increases performance. In one embodiment, a routine for positioning active electronic testing components near probe elements is provided. This routine includes sealing active components in a package, coupling the package to probe elements, and circulating coolant through the package during operation of the active components in testing.

One additional advantage of a probe card cooling assembly with direct cooling according to the present invention is it is easy to disassemble for maintenance and repair. Another advantage of the probe card cooling assembly with direct cooling according to the present invention is that it is inexpensive to assemble. Another advantage is that in certain embodiments electrical interconnects can be made to both the top and bottom of the package.

Further, in another embodiment of the present invention, a probe card cooling assembly according to the present invention includes a cooling member and a cooled package with one or more heat radiators such as cooling fins. The cooled package includes a housing that encloses a cavity. A coolant fills the cavity. One or more dies are mounted on a substrate within the cavity and are directly cooled by surrounding coolant. In this embodiment, however, heat is transferred away from the coolant by one or more heat radiators to the cooling member.

Further features and advantages of the present invention, as well as the structure and operation of various embodiments of the present invention, are described in detail below with reference to the accompanying drawings.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention. In the accompanying drawings:

FIGS. 8-11 are diagrams of types of spring contacts that can be used in a cooled package according to a further feature of the present invention. FIGS. 9A, 9B, 10A-10C and 11 illustrate spring contacts that are made lithographically rather than by a wire bonding technique.

DETAILED DESCRIPTION OF THE INVENTION

Table of Contents

Figure 1:
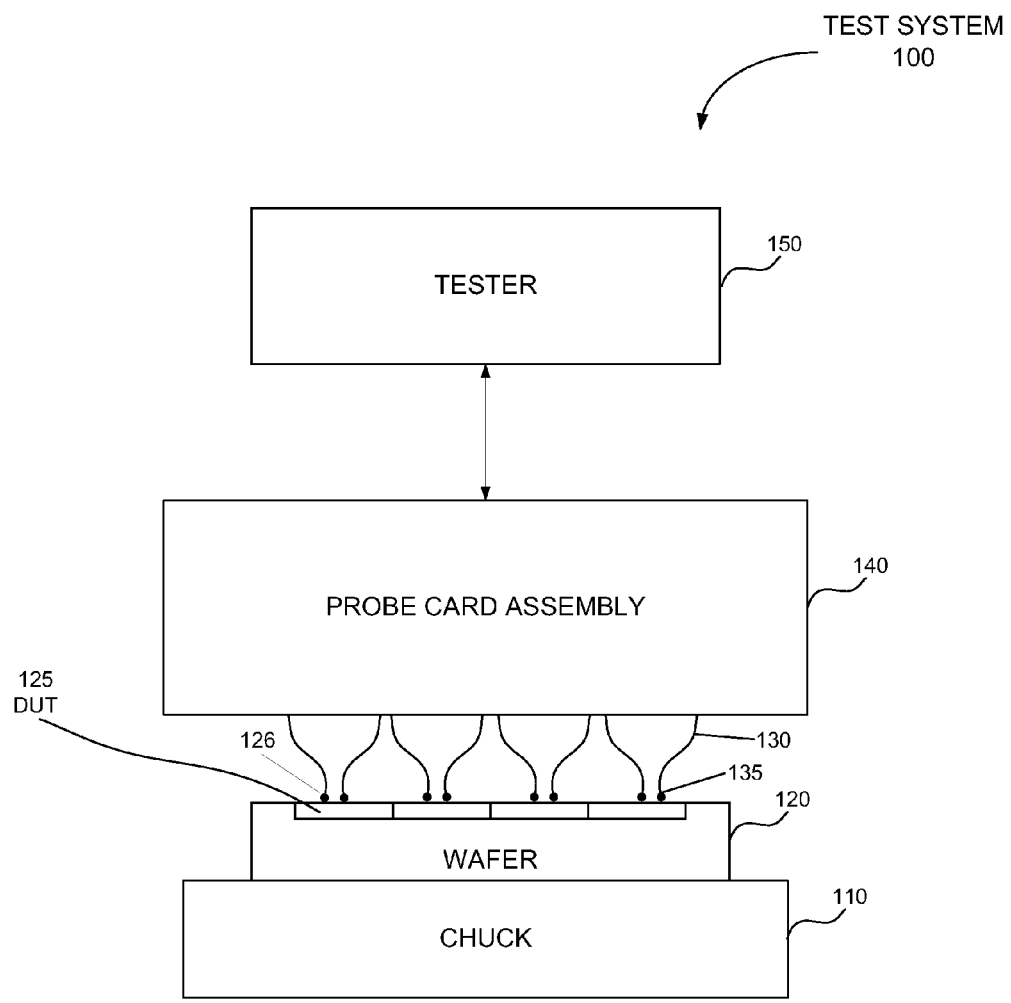
FIG. 1 is a side view of certain components in use in a conventional test system including a probe card and wafer.
Figure 2:
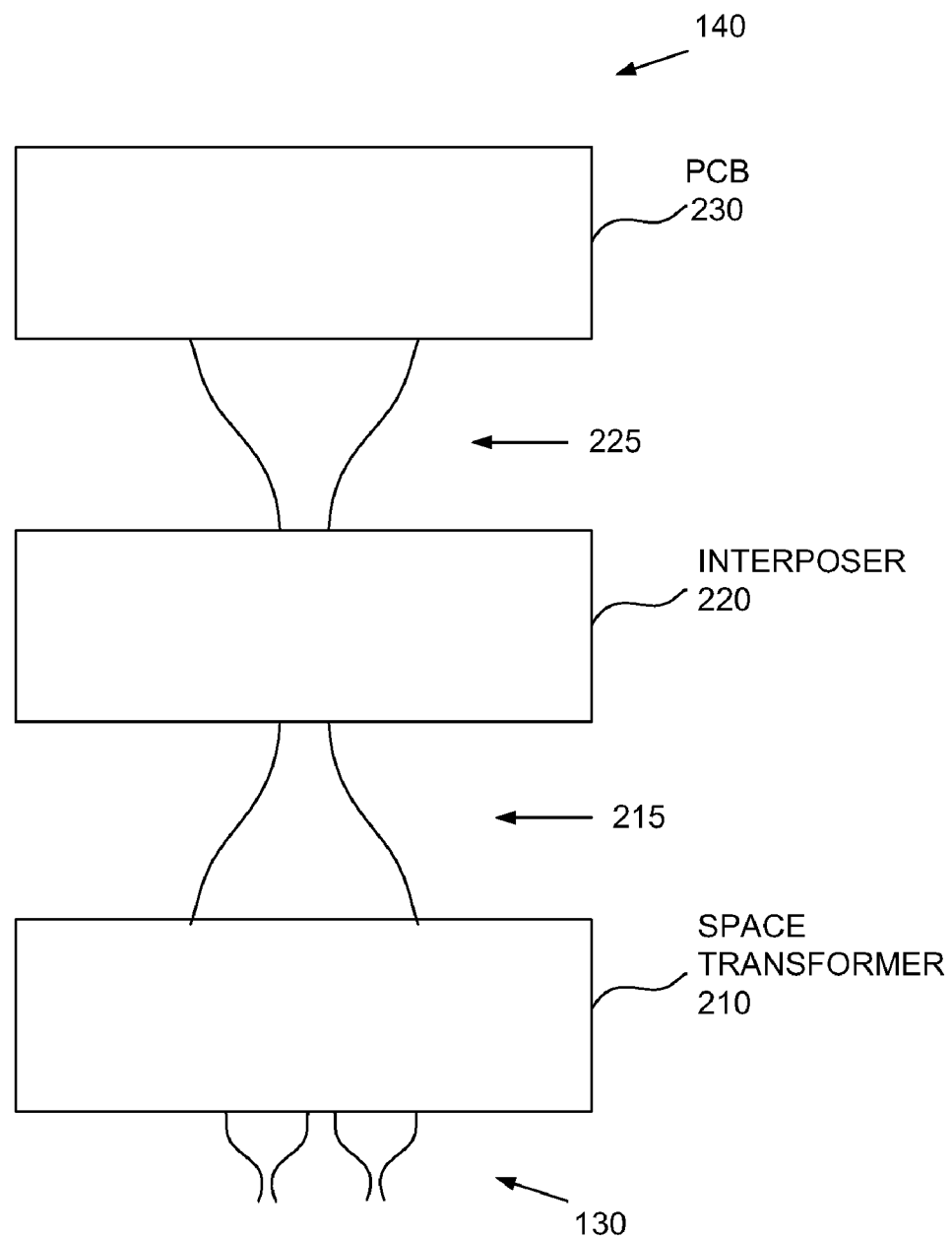
FIG. 2 is a side view of a conventional probe card assembly used in the test system of FIG. 1.

1. Overview and Discussion
2. Terminology
3. Probe Card Cooling Assembly
4. Cooled Package with One or More Dies
5. High-Density Cooled Packages
6. Routine for Incorporating Active Electronic Components Near Probe Elements
7. Types of Springs Contacts
8. Additional Embodiments
9. Conclusion The following description is for the best modes presently contemplated for practicing the invention. This description is not to be taken in a limiting sense, but is made merely for the purpose of describing the general principles of the invention. The scope of the invention should be ascertained with reference to the claims. In the description of the invention that follows, like numerals or reference designators will be used to refer to like parts or elements throughout.

1. OVERVIEW AND DISCUSSION

The present invention provides a probe card cooling assembly. The probe card cooling assembly includes a cooled package with one or more dies. Each die is directly cooled on one or more sides by a coolant present within the cooled package. Embodiments of the present invention are described with respect to a cooled high-density package. The present invention can include but is not limited cooled high-density package. In general, a probe card cooling assembly according to the present invention can include only one die or a plurality of dies arranged in any configuration or layout within a cooled package.

The present invention is described in terms of a test system environment. For example, the present invention can be used with a commercially available test system or tester from Teradyne, Advantest, Electro-Glass, TSK, TEL, Agilent or other manufacturer. Description in these terms is provided for convenience only. It is not intended that the invention be limited to application of these example environments. In fact, after reading the following description, it will become apparent to a person skilled in the relevant art how to implement the invention in alternative environments known now or developed in the future.

2. TERMINOLOGY

To more clearly delineate the present invention, an effort is made throughout the specification to adhere to the following term definitions as consistently as possible.

The term "die" refers to any integrated circuit, chip, silicon chip or other semiconductor or electronic device.

The terms "interconnect" and "interconnection element" refer to any electrical connection, including but not limited to a compliant interconnect.

The term "compliant interconnect" refers to a non-rigid electrical connection including, but not limited to, a spring contact available from FormFactor, Inc. and the types of spring contacts described herein.

The term "active electronic component" refers to any heat generating electronic component including but not limited to a transistor, switch, resistor, logic gate, or integrated circuit.

The term "direct cooling of an active electronic component" as used to describe the present invention refers to influencing the temperature of an active electronic component with a coolant placed in thermal contact with the active electronic component.

3. PROBE CARD COOLING ASSEMBLY

Figure 3A:
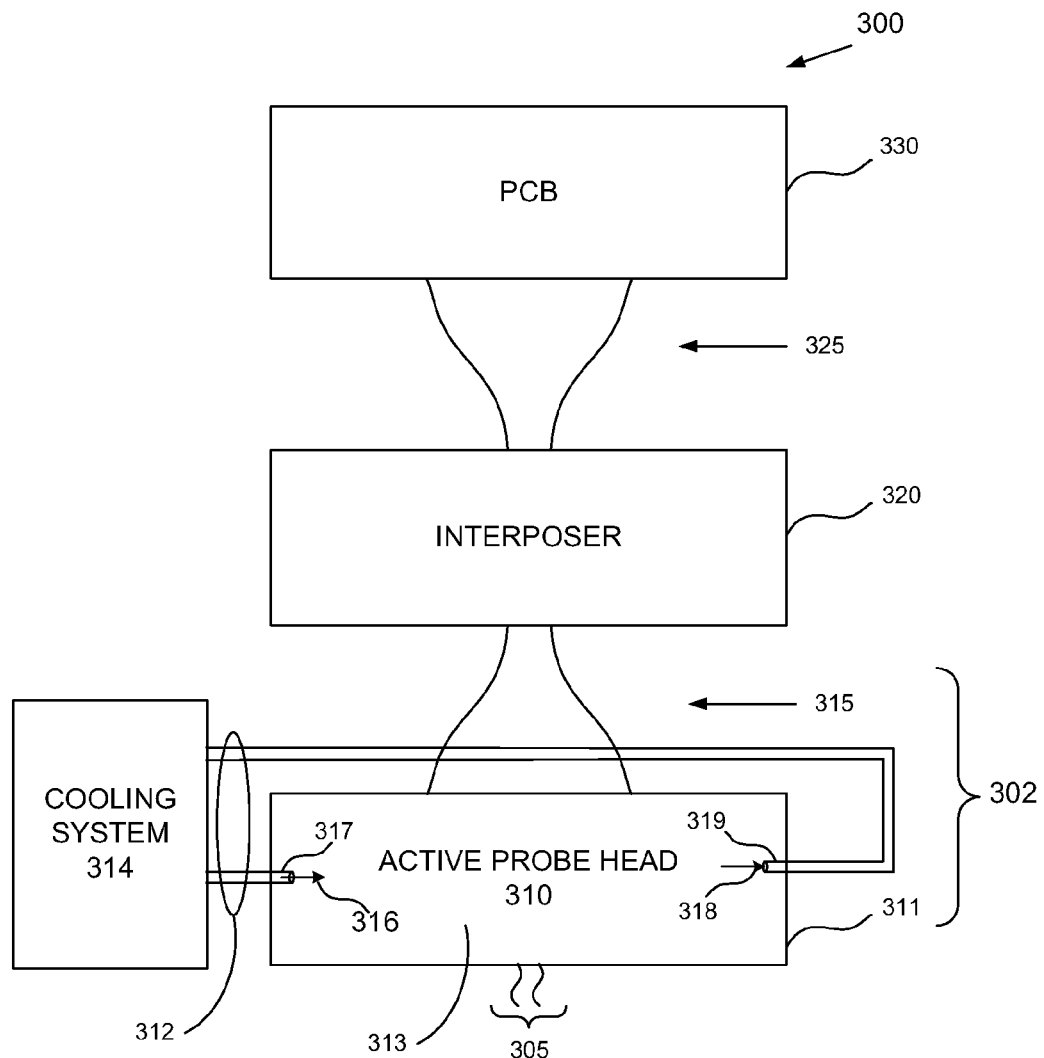
FIG. 3A is a side view of a probe card assembly including a probe card cooling assembly according to an embodiment of the present invention.

FIG. 3A is a diagram of a probe card assembly 300 that includes a probe card cooling assembly 302 according to the present invention. Probe card assembly 300 further includes probe elements 305, interposer 320, and printed circuit board 330. Probe card cooling assembly 302 is coupled between probe elements 305 and electrical interconnects 315. Interposer 320 is coupled between electrical interconnects 315 and electrical interconnects 325. Printed circuit board 330 is coupled between electrical interconnects 325 and a computer (not shown). Probe elements 305 can include, but are not limited to, tungsten needles, vertical probes, cobra probes, L-type probes, plunger probes, spring contact probes, and contact bump probes formed on a membrane. Electrical interconnections 315 and 325 can be any type of electrical interconnection. In one preferred example, compliant interconnections are used. For example, compliant interconnections can be used as described in commonly-assigned U.S. Pat. No. 5,974,662, issued to Eldridge et al. (see, for example, probe card assembly 500 in FIG. 5), incorporated by reference in its entirety herein. Interposer 320 and printed circuit board 330 are illustrative and not intended to limit the present invention. For example, interposer 320 and PCB 330 can be omitted, and probe card cooling assembly 302 is coupled directly to a computer or other device in a tester system.

Probe card cooling assembly 302 includes an active probe head 310, coolant circulation system 312, and cooling system 314. Active probe head 310 is a package that includes one or more active electronic components (not shown in FIG. 3A). The package includes a housing 311 that encloses a cavity 313. In embodiments, only one die or a plurality of dies are arranged within cavity 313. In other embodiments, active probe head 310 is a high-density package with a plurality of dies arranged in a compact configuration. Examples of cooled packages having one or more dies are described below with respect to FIGS. 3B-3D. Further examples of cooled high-density packages used in active probe head 310 according to the present invention are described below with respect to FIGS. 4-6.

The housing of a cooled package further includes coolant ports 317, 319 coupled to the coolant circulation system 312. Coolant port 317 allows coolant to enter cavity 313 as shown by directional arrow 316. Coolant port 319 allows circulating coolant to exit cavity 313 as shown by directional arrow 318. Coolant circulates in cavity 313 and directly contacts active electronic components. Active electronic components can be positioned at or near one or more surfaces of a die so that heat is transferred from the surfaces to the coolant. Moreover, in embodiments, the coolant can directly contact most or all of a surface area on one or more sides of a die. In this way, hot spots are reduced or eliminated.

Cooling system 314 is coupled through coolant circulation system 312 to the coolant ports 317, 319 of active probe head 310. Coolant circulation system 312 can be any type of pipe or conduit for carrying coolant to and from active probe head 310 and cooling system 314. Cooling system 314 is any type of conventional cooling system for circulating coolant and transferring heat. Multiple coolant ports and mechanical devices can be used to evenly distribute coolant within a cavity or to distribute coolant in a particular way. One bi-directional coolant port can also be used. In one example, a tank holding liquid coolant is used in cooling system 314. Pumps are used to drive liquid to and from the coolant circulation system 312. A refrigerator coil is provided in the tank to cool the coolant to a desired temperature. A heater coil can also be added to the tank if further control of the temperature of the coolant is desired.

Cooling system 314 can circulate any type of liquid coolant and/or gas coolant. Example types of coolant include, but are not limited to, ethylene glycol, liquified nitrogen, fluorocarbons, FLORINERT, FREON, and a combination of FREON and a nonfreezing liquid.

Figure 3B:
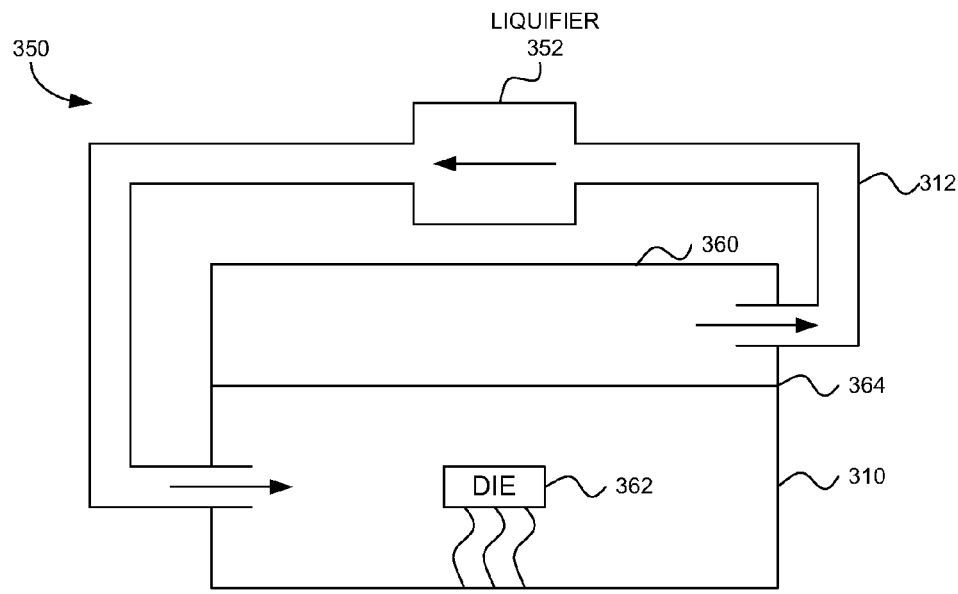
FIG. 3B is a diagram of a probe card cooling assembly according to an embodiment of the present invention.
Figure 3C:
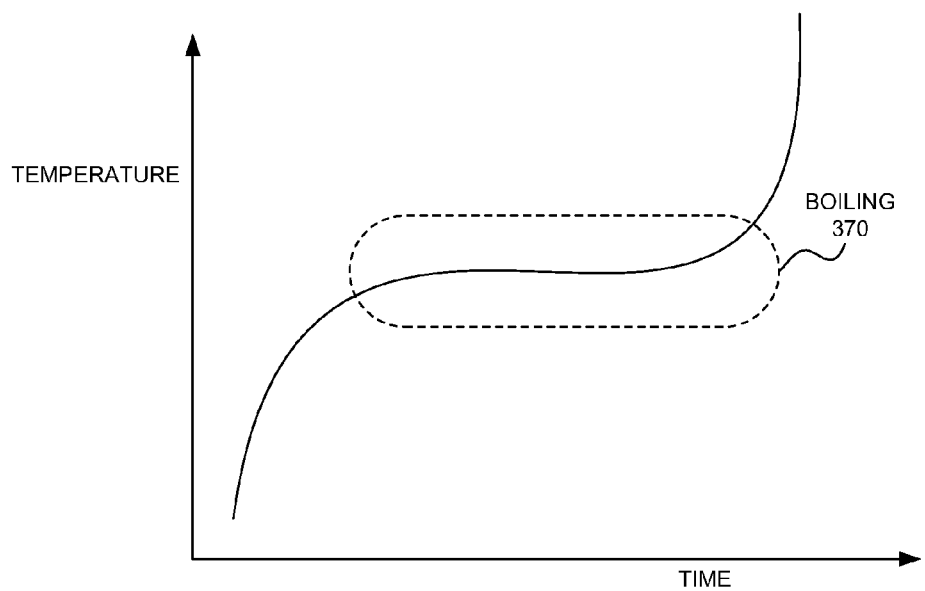
FIG. 3C is an example plot that illustrates the principle of how a liquid coolant generally remains at a constant temperature during a boiling range during operation of the probe card cooling assembly shown in FIG. 3B.

FIG. 3B shows another embodiment of a probe card cooling assembly 350. Probe card cooling assembly 350 includes a liquid coolant that boils at about the desired operating temperature of a die. Coolant is pumped through coolant circulation system 312 into a cavity within housing 360 so that one or more dies 362 are immersed in the liquid coolant below a coolant level 364. During testing operations, each die 362 may generate sufficient heat to cause microboiling near active surfaces of the die. Such microboiling converts some of the liquid coolant into a gas. This provides an additional advantage in that the liquid coolant surrounding each die 362 generally remains at a constant temperature during boiling. This also serves to increase the operating temperature range of the die. FIG. 3C is an example plot that illustrates the principle of how a liquid coolant generally remains at a constant temperature during a boiling range 370. A combination of liquid and gas (or gas only) then exits housing 360 and travels through coolant circulation system 312 to liquifier 352. Liquifier 352 converts the coolant from a gas phase back into a liquid phase before pumping or circulating the coolant back into housing 360.

Examples of cooled packages which can be used in an active probe head 310 are now described in further detail with respect to FIGS. 3D and 4-6. These examples are illustrative and not intended to limit the present invention.

4. COOLED PACKAGE WITH ONE OR MORE DIES

Figure 3D:
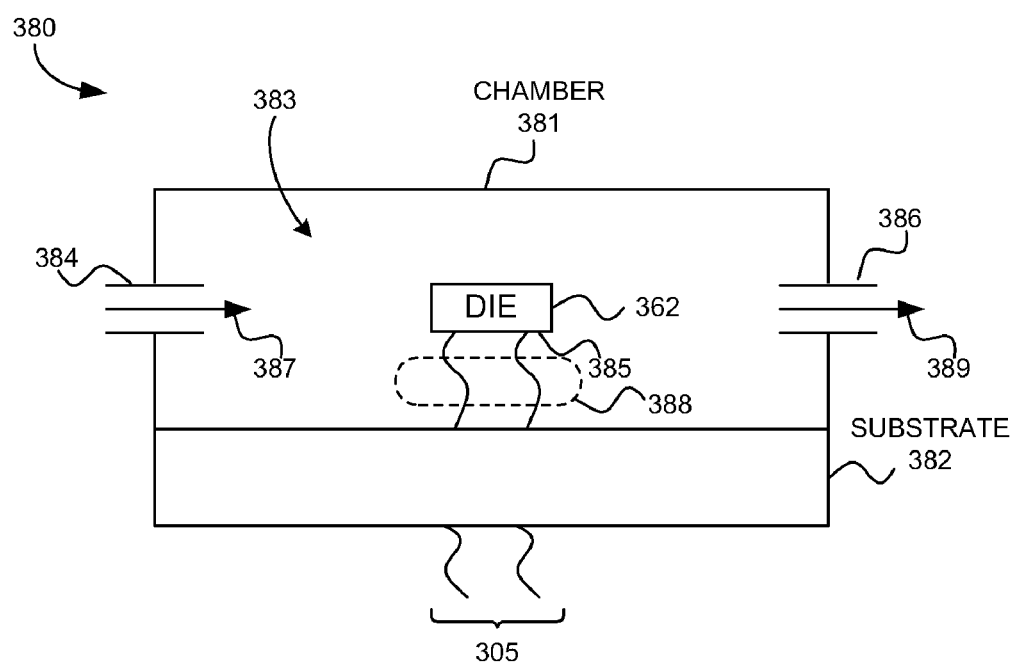
FIG. 3D is a diagram of a probe card cooling assembly according to an embodiment of the present invention.

FIG. 3D is a diagram of a cooled package 380 that can be used in an active probe head according to a further embodiment of the present invention. Cooled package 380 includes a housing made up of a chamber 381 and bottom substrate 382.

Chamber 381 can be made from ceramic, stamped metal, molded plastic, cast metal, etc. Bottom substrate 382 can be any type of substrate including, but not limited to, a substrate made of FR-4, ceramic, copper-invar-copper, etc.

One or more dies 362 are coupled to a surface of bottom substrate 382 and positioned within a cavity 383 in chamber 381. One die 362 may be used as shown in FIG. 3D. Alternatively, a plurality of dies 362 may be used. Die(s) 362 can be arranged in any desired layout on the surface of the bottom substrate 382. Each die 362 is coupled to bottom substrate 382 through respective interconnects 388. Interconnects 388 can be any type of electrical interconnection element, including but not limited to compliant interconnects. Examples of compliant interconnects are further described below. In one preferred embodiment, each die 362 is coupled to bottom substrate 382 through respective groups of compliant interconnects 388. Die(s) 362 are further mounted such that an active surface 385 of a die 362 faces toward an inside surface of bottom substrate 382. Probe elements 305 extend from an outside surface of the bottom substrate 382 such that tips on probe elements 305 engage with DUTs on a wafer (not shown).

In FIG. 3D, two coolant ports 384, 386 are shown. Coolant port 384 allows coolant from cooling system 314 to pass into chamber 381 as indicated by directional arrow 387. Coolant port 386 allows coolant within chamber 381 to pass out to cooling system 314 as indicated by directional arrow 389. In one example, coolant ports 384, 386 are one-way fluid flow valves. In other examples, one port or many ports of any type can be used. Such ports and/or other mechanical devices can permit a one-way or two-way flow of coolant.

Within a cavity in chamber 381, the coolant freely circulates around all sides of die(s) 362 and interconnects 388. The coolant directly cools active electronic components on die(s) 362. In this way, the present invention reduces the magnitude of thermal gradients across each die and makes remaining thermal gradients (if any) more even across each die. Hot spots are reduced or eliminated. Die operating temperature range is increased.

According to one feature of the present invention, die(s) 362 are preferably arranged along a plane parallel to the plane of bottom substrate 382 and a plane of a wafer under test (not shown) and probe elements 305. Cooled package 380 has probe elements 305 coupled directly to bottom substrate 382. Further, part or all of testing circuitry and processing can be incorporated into one or more die(s) 362. In this way, the distance of an electrical path from probe elements 305 to active test circuitry is minimized. By minimizing temperature variation across the die with direct cooling and minimizing the electrical path length over which signals travel, cooled package 380 reduces electrical parameter variation and parasitics, and provides an improved uniformity of output signal characteristics such as rise time and pin-to-pin skew.

Cooled package 380 further includes output contacts (not shown) coupled to one surface of bottom substrate 382. Output contacts can be provided on an bottom substrate 382 or on chamber 381. Any type of output contact for cooled package 380 can be used including, but not limited to, any type of interconnection element, such as, spring contacts, pins, solder columns, bumps, contact elements, etc. Example output contacts are further described with respect to interconnection elements used in the high-density cooled packages of FIGS. 4-6.

5. HIGH-DENSITY COOLED PACKAGES

Figure 4A:
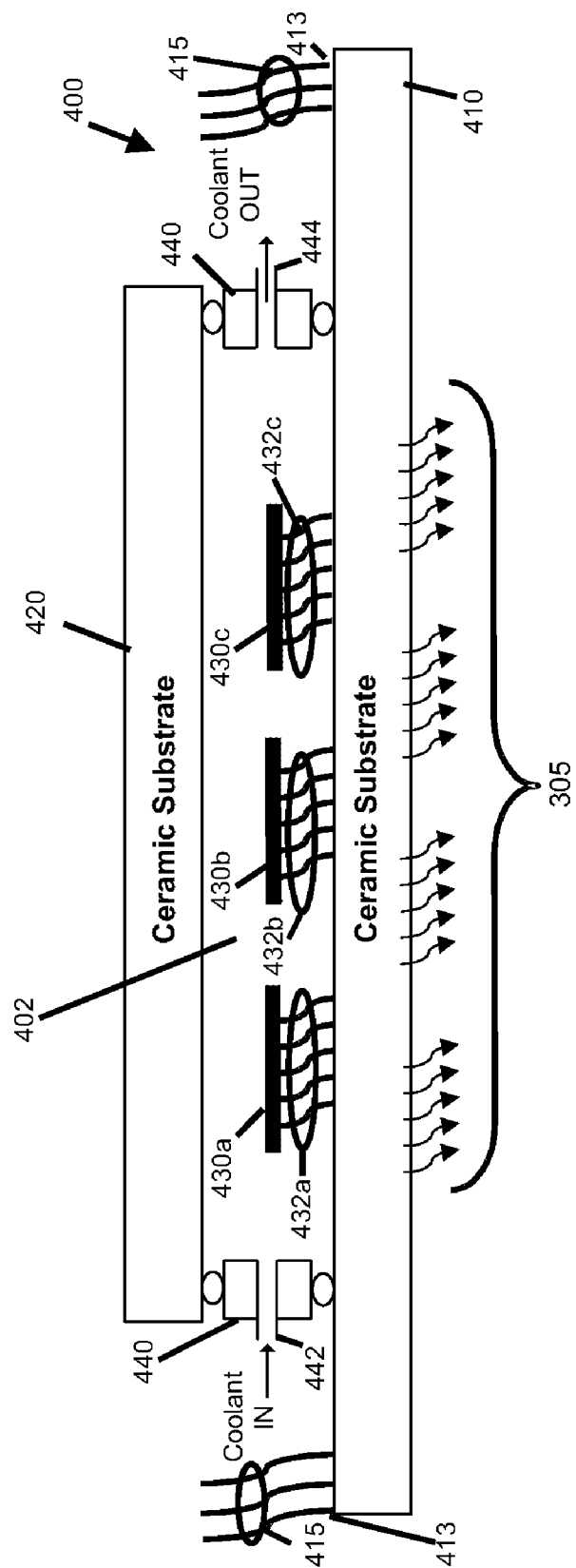
FIG. 4A is a diagram of a high-density package with output contacts at the edge of a substrate according to an embodiment of the present invention.

FIG. 4A is a diagram of a high-density cooled package 400 according to an embodiment of the present invention. High density cooled package 400 includes a housing made up of a bottom ceramic substrate 410 and top ceramic substrate 420. Top and bottom ceramic substrates 410 and 420 are sealed by a seal 440 and enclose a cavity 402. Seal 440 can be any type of seal that can retain a coolant. In one example, seal 440 is an O-ring.

An array of dies 430a-430c are coupled to a surface of bottom ceramic substrate 410 within cavity 402. Any number of dies 430 may be used to cover the available surface area (also called package component area) on the surface of the bottom ceramic substrate 410 within cavity 402. In one embodiment, sixty-four dies are provided in a densely packed, multi-chip arrangement.

In one preferred embodiment, each of the dies 430a-430c are coupled to the bottom ceramic substrate 410 through respective compliant interconnects 432a-432c. Dies 430 are further mounted to face bottom ceramic substrate 410. In particular, an active surface of the die 430a faces bottom ceramic substrate 410. Active surfaces of other dies 430b-430c similarly face bottom ceramic substrate 410.

In FIG. 4A, two coolant ports 442 and 444 are shown. Coolant port 442 allows coolant from cooling system 314 (not shown in FIG. 4A) to pass into cavity 402. Coolant port 444 allows coolant within cavity 402 to flow back toward cooling system 314. In one example, coolant ports 442 and 444 are one-way fluid flow valves. Within cavity 402, the coolant freely circulates around all sides of dies 430 and compliant interconnects 432. The coolant directly cools active electronic components on dies 430. In this way, the present invention reduces the magnitude of thermal gradients across each die and makes remaining thermal gradients more even across each die. Hot spots are reduced or eliminated.

Dies 430 are preferably arranged along a plane parallel to the plane of the bottom ceramic substrate 410 and a plane of a wafer and probe elements 305. The high-density package has probe elements 305 coupled directly to the bottom substrate 410. Further part or all of testing circuitry and processing can be incorporated in dies 430. In this way, the distance of an electrical path from probe elements 305 to active test circuitry is minimized. By minimizing temperature variation across the die with direct cooling and minimizing the electrical path length over which signals travel, high-density package 400 reduces parasitics and provides an improved uniformity of output signal characteristics such as rise time and pin-to-pin skew.

High-density package 400 further includes output contacts 413 coupled to one surface of bottom ceramic substrate 410. Output contacts 413 are provided on an edge region of the bottom ceramic substrate 410 and are electrically coupled to interconnection elements 415. In one example, output contacts 413 can be a land grid array (LGA) pattern. Interconnection elements 415 can be any type of electrical interconnection element, including but not limited to compliant interconnects. Interconnects 415 are further coupled to any external component. In a testing environment, interconnects 415 can be coupled to an interposer or printed circuit board, or to another external component in the test system.

Figure 4B:
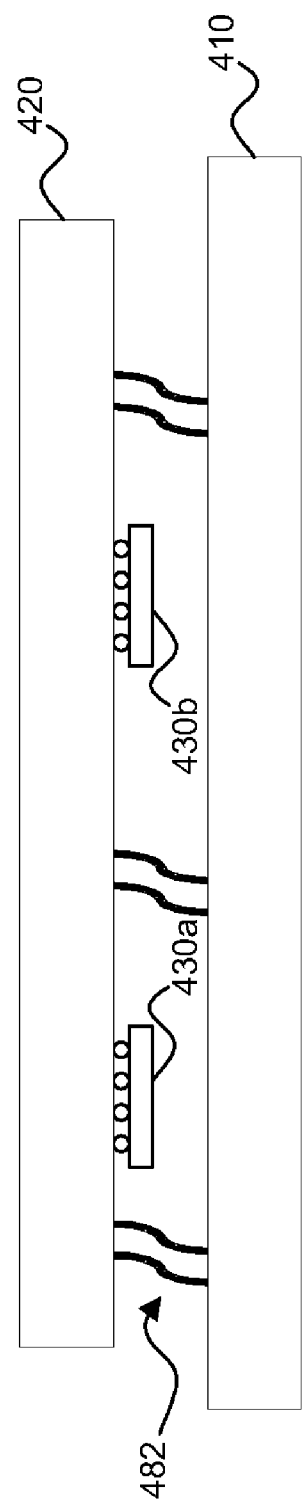
FIG. 4B is a diagram that shows dies mounted in a stacked die arrangement according to an embodiment of the present invention.

FIG. 4B is a diagram that shows dies 430a, 430b mounted in a stacked die arrangement according to an embodiment of the present invention. Dies 430*a*, 430*b* are flip-chip bonded to top substrate 420. Top substrate 420 is then coupled by compliant interconnects 482 to bottom substrate 410. This stacked die arrangement can be implemented in any of the cooled packages described herein including but not limited to high-density cooled packages. Coolant circulates around dies 430*a*, 430*b* to directly cool die surfaces.

Figure 4C:
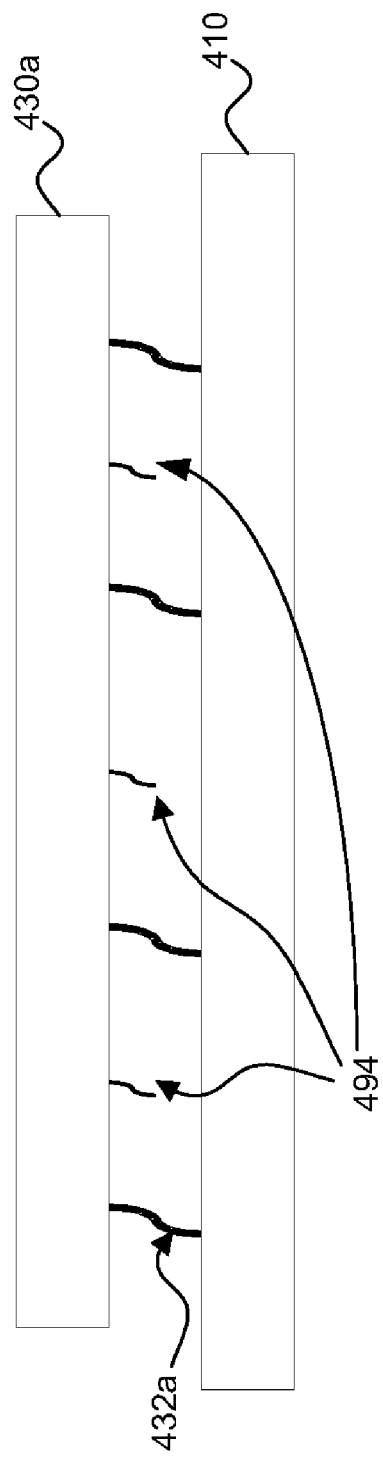
FIG. 4C is a diagram that illustrates non-contacting compliant interconnects provided on a die surface according to a further feature of the present invention.

FIG. 4C is a diagram that illustrates non-contacting compliant interconnects 494 provided on a die surface 430*a* according to a further feature of the present invention. Coolant circulates around die 430*a*, compliant interconnects 432*a*, and non-contacting compliant interconnects 494 to directly cool die surfaces. Non-contacting compliant interconnects 494 can be any type of compliant interconnect such as a spring. As shown in FIG. 4C, non-contacting compliant interconnects 494 do not contact bottom substrate 410, but serve to direct heat away from areas of the die surface. This further improves cooling of die(s) in a cooled package according to the present invention. This arrangement of one or more dies with non-contacting compliant interconnects can be implemented in any of the cooled packages described herein including but not limited to high-density cooled packages.

Figure 5:
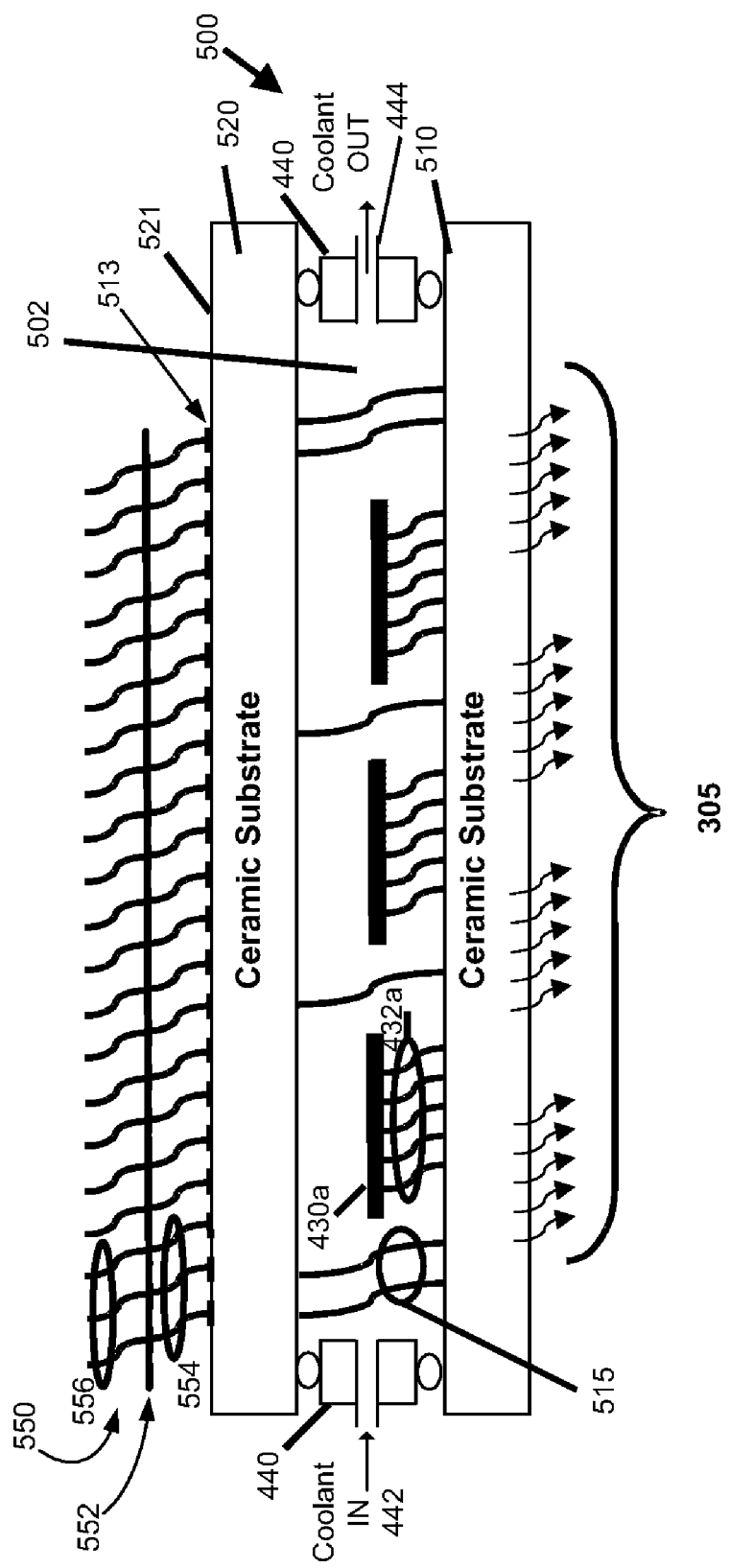
FIG. 5 is a diagram of a high-density package with electrical connection through a housing cavity and output contacts on a top ceramic substrate.

FIG. 5 is a diagram of a high-density package according to a further embodiment of the present invention. High-density package 500 includes a housing that encloses a cavity 502. The housing includes a bottom ceramic substrate 510 and top ceramic substrate 520. Top and bottom ceramic substrates 510 and 520 are coupled in a sealed package by seal 440. Coolant ports 442 and 444 allow the circulation of a liquid coolant through cavity 502, as described above with respect to FIG. 4. In a testing environment, bottom ceramic substrate 510 is coupled on one surface to probe elements 305. Another surface of bottom ceramic substrate 510 is coupled to dies 430 through compliant interconnects 432.

Figure 6:
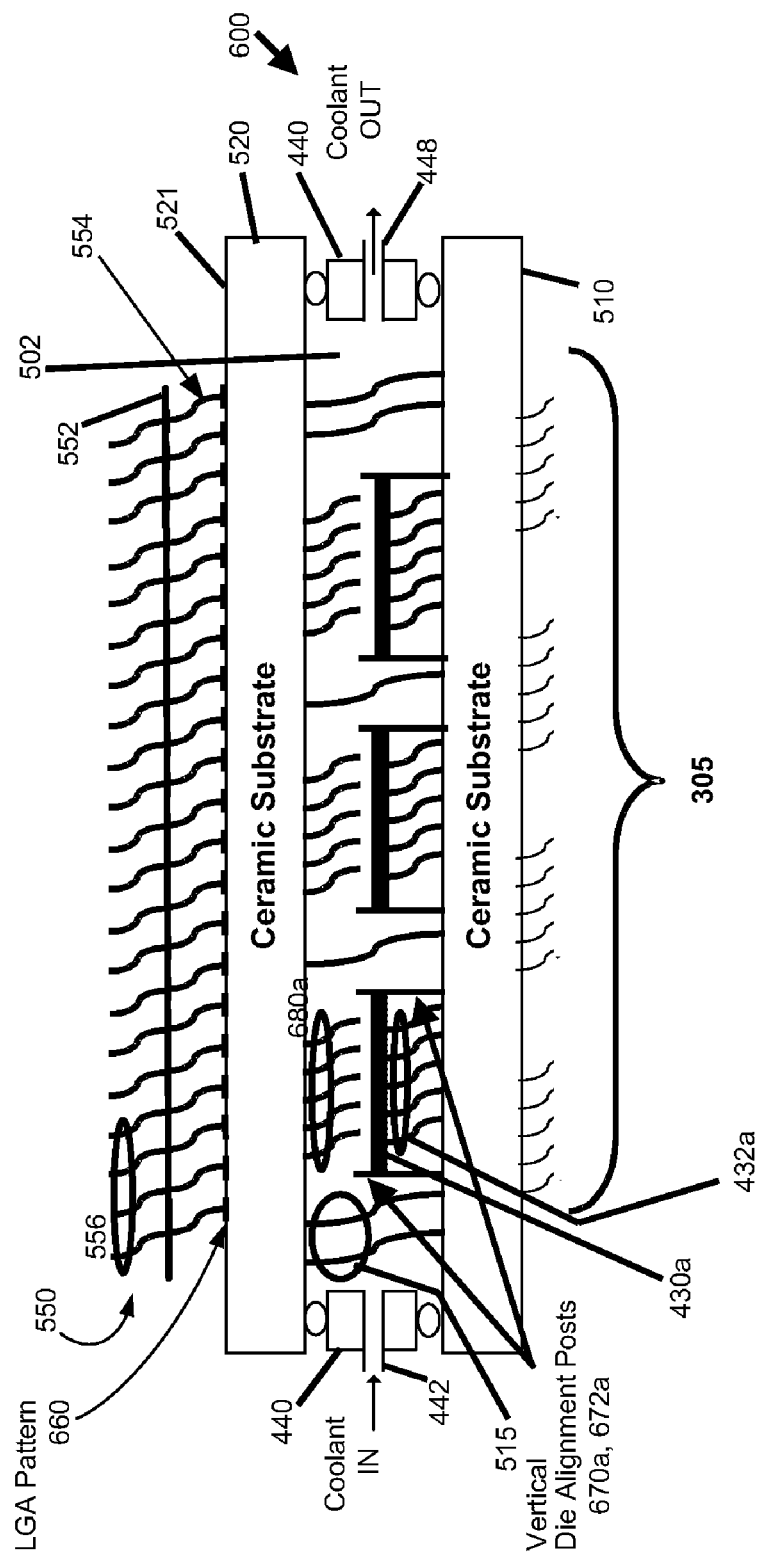
FIG. 6 is a diagram of a high-density package illustrating dies attached in a socket configuration according to an embodiment of the present invention.

Unlike package 400, package 500 includes output contacts 513 provided on a top surface 521 of top ceramic substrate 520. Output contacts 513, for example, can be a LGA pattern (as shown in FIG. 6). Also, interconnections 515 are provided through cavity 502 between top and bottom ceramic substrates 510, 520. Any number of interconnections 515 can be provided as desired. Package 500 has all the advantages described above with respect to package 400, in that the thermal gradients in dies 430 are reduced and the electrical path from probe elements 305 to dies 430 is relatively short. Package 500 is even more compact, in that the output contacts do not have to be provided on an edge region of the bottom ceramic substrate 510. Instead, output contacts 513 are provided on the top surface 521 of top ceramic substrate 520. In this way, electrical signals can pass through output contacts 513 to any external components such as the spring contact interposer shown in FIG. 5. In the embodiment shown in FIG. 5, interposer 550 has a substrate 552, a first set of interconnects 554 connecting one surface of substrate 552 to output contacts 513, and a second set of interconnects 556 extending from the opposite surface of substrate 552 for connecting to another component (not shown). Interposer 550 is optional, and in general, output contacts 513 can be coupled to any external component in a test system or other electronic package environment.

FIG. 6 is a diagram of a high-density package 600 according to a further embodiment of the present invention. High-density package 600 is identical to package 500, except that the dies 430 are coupled to bottom ceramic substrate 510 in a socket configuration. Die alignment posts 670, 672 are provided for each die 430. In FIG. 6, die alignment posts 670*a*, 672*a* are provided on opposite sides of die 430*a*. Die 430*a* is held by frictional contact with die alignment posts 670*a* and 672*a*, and by compliant interconnections 432*a* and 680*a*, to maintain its position. In particular, compliant interconnections 680*a* provide a downward pressure to hold dies 430*s* in place in the sockets. Coolant provided within cavity 502 is still able to circulate on exposed sides of the die 430. Even though FIG. 6 shows a socket configuration of dies with respect to the high-density package 500, the present invention is not so limited. In particular, a socket configuration can also be used in any cooled package having any number of dies or any layout of dies by providing die alignment posts.

6. ROUTINE FOR INCORPORATING ACTIVE ELECTRONIC COMPONENTS NEAR PROBE ELEMENTS

Figure 7:
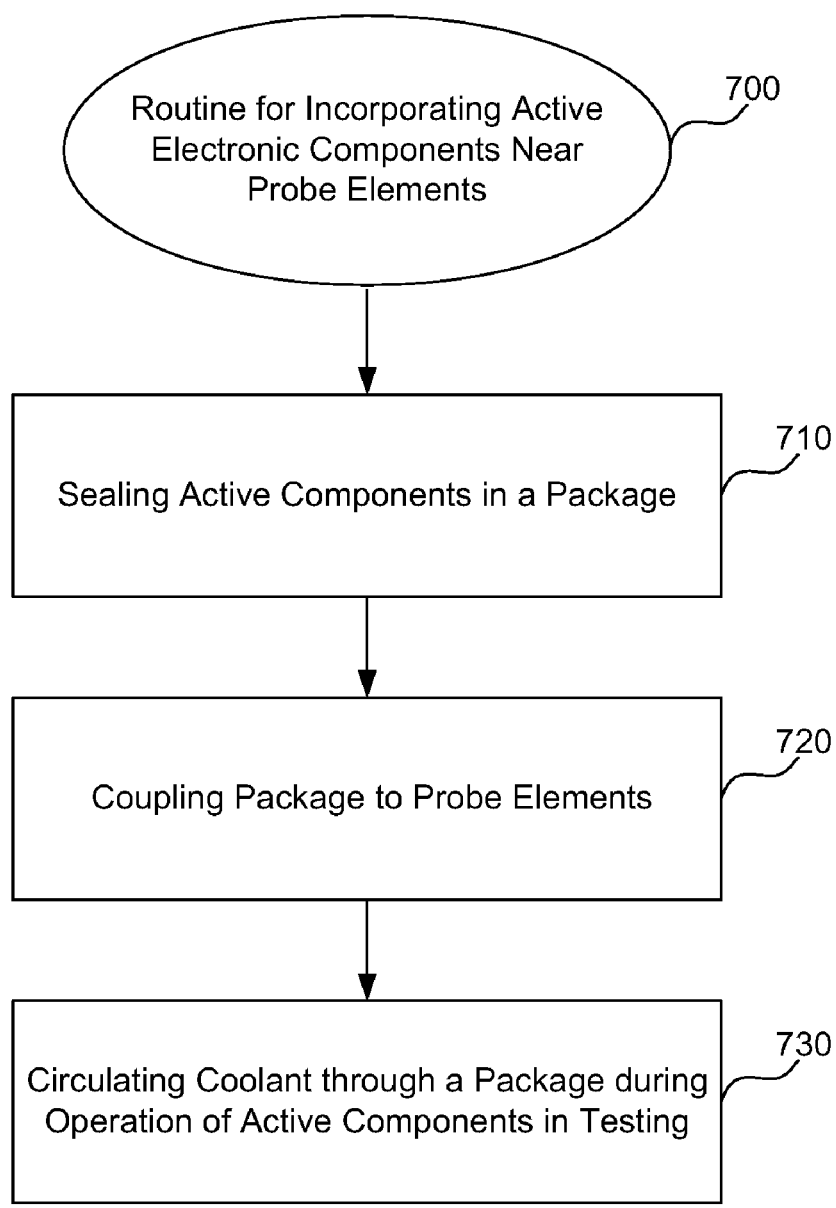
FIG. 7 is a flowchart of a routine for incorporating active electronic components near probe elements according to an embodiment of the present invention.

FIG. 7 is a flowchart of a routine 700 for incorporating active electronic components near probe elements according to an embodiment of the present invention (steps 710-730). In step 710, active electronic components are sealed in a package. These active electronic components can carry out part or all of the functionality carried out in a tester to test DUTs. In step 720, the package is coupled to probe elements. In step 730, a coolant is circulated through the package during operation of active components in testing to reduce thermal variations across dies.

7. TYPES OF SPRING CONTACTS

According to a further feature of the present invention, spring contacts are used within a cooled package to couple one or more dies to a substrate. Such spring contacts have an advantage in that they allow coolant to flow around all sides of a die and around the spring contacts themselves without impairing electrical connection between the die and the substrate. The spring contacts are not completely rigid and can maintain their physical integrity in the presence of circulating coolant. Also, the spring contacts can enhance direct cooling as they have a length that allows coolant circulation and thermal transfer away from an active surface of a die even if the die is mounted to face a substrate. Spring contacts are also fairly strong by themselves and do not require the use of epoxy or other material which would reduce the surface area on a die which is directly cooled by circulating coolant.

Any type of spring contact can be used in a cooled package according to a further feature of the present invention. A spring contact (also referred to as a contact spring or as a spring) can include, but is not limited to, any spring contact available now or in the future from FormFactor, Inc. a Delaware corporation. FIGS. 8-11 are diagrams of three types of example spring contacts that can be used in a cooled package. The three types of spring contacts are wirebond, multipart lithographic, and integrally formed springs.

FIGS. 8-11 are diagrams of three types of example spring contacts that can be used in a cooled package. The first type is a wirebond spring contact. FIG. 8A illustrates an exemplary conductive spring contact 810 that may be secured to an input/output terminal 804 on a substrate 802. The exemplary spring contact 810 comprises an inner core 830 made of a readily shapeable material and a coating material 832 made of a resilient material. The spring contact 810 is preferably made by wire bonding the inner core 830 to the input/output terminal 804. Because the inner core 830 is made of a readily shapeable material, the inner core may be formed in just about any shape imaginable, including without limitation shapes having a bend or change of direction as illustrated in FIG. 8B, and shapes having multiple changes in direction. Then, the coating material 832 is applied over the inner core 830. The coating material 832 gives the spring contact 810 resiliency.

Many variations of the spring 810 are possible. For example, additional layers of materials may be added to the spring contact for a variety of purposes.

Figure 8A:
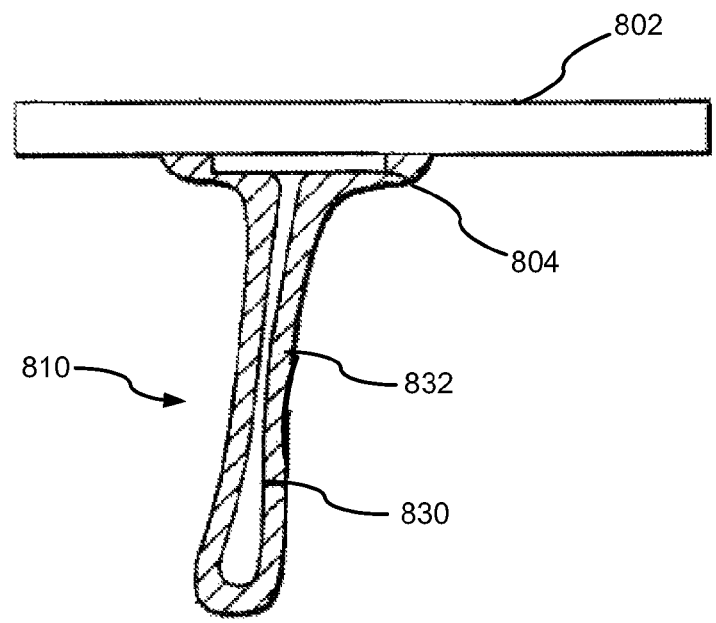
FIGS. 8A and 8B illustrate examples of wire bond type spring contacts that can be used in a cooled package.
Figure 8B:
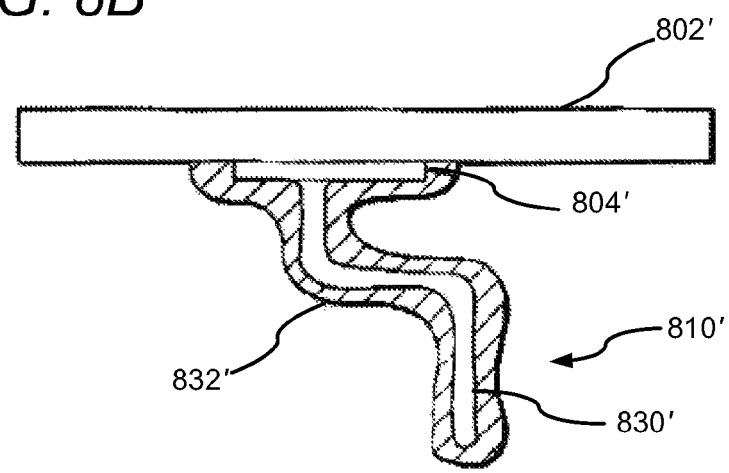

FIG. 8B shows an example spring 810' having two bends. Spring 810' includes an inner core 830' made of a readily shapeable material and a coating material 832' made of a resilient material. Spring contact 810' is preferably made by wire bonding the inner core 830' to the input/output terminal 804'. Then, the coating material 832' is applied over the inner core 830'. Further examples of such spring contacts are described in commonly-assigned U.S. Pat. Nos. 5,476,211, 5,917,707, and 6,110,823, each of which is incorporated herein in its entirety by reference.

Figure 9A:
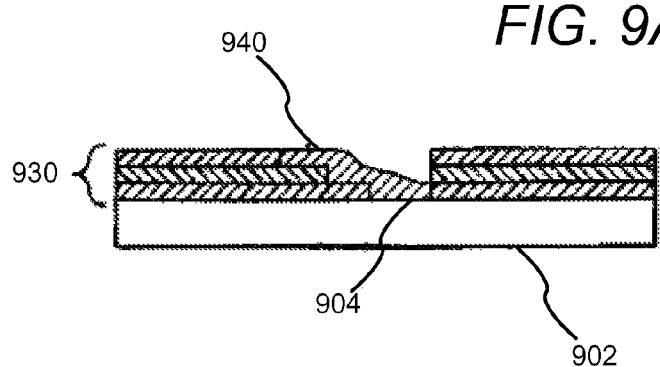
Figure 9B:
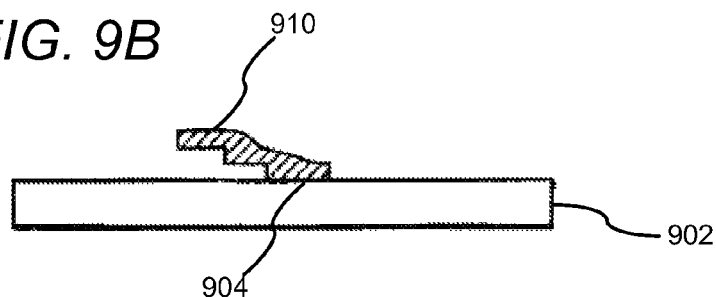

FIGS. 9A, 9B, 10A-10C and 11 illustrate spring contacts that are made lithographically rather than by a wire bonding technique illustrated in FIGS. 8A and 8B. Such spring contacts are made using lithographic techniques similar to techniques used for making integrated circuits. That is, one or more masking layers are used to create a pattern in which elements of the spring contact are formed. FIGS. 9A and 9B illustrate an example in which a contact spring is formed lithographically. As shown one or more masking layers 930 are formed on a substrate 902. Masking layers 930 form an opening over an input/output terminal 904 of substrate 902 and also define a shape of the spring contact. Material 940 is then deposited on the pattern formed by the masking layers 930. As shown in FIG. 9B, the masking layers are then removed, leaving a spring contact 910 that is secured to the input/output terminal 904. The spring may be made of a single, springy material. Alternatively, the spring may be made of multiple layers of materials. For example, the initial material 940 deposited in the masking layers 930 may be a flexible material such as forms the inner core of the springs illustrated in FIGS. 8A and 8B. That material may then be coated, for example, after the masking layers are removed, with a resilient material as described above with regard to FIGS. 8A and 8B.

Figure 10A:
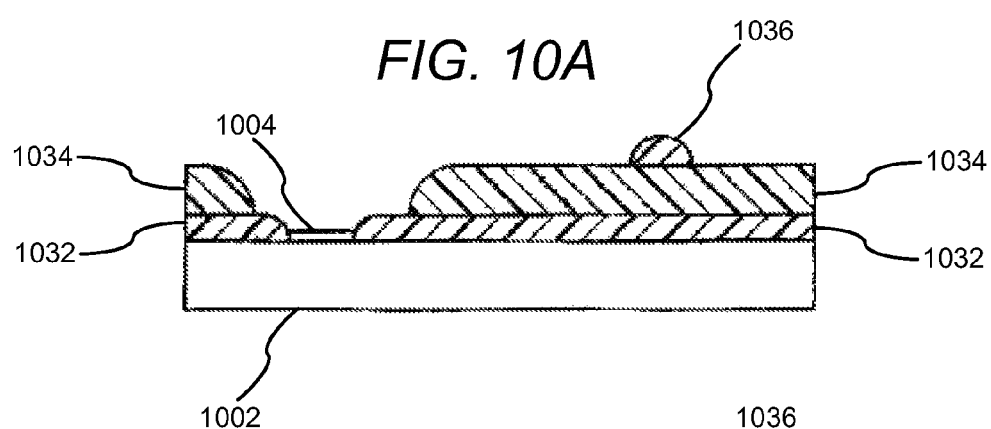
Figure 10B:
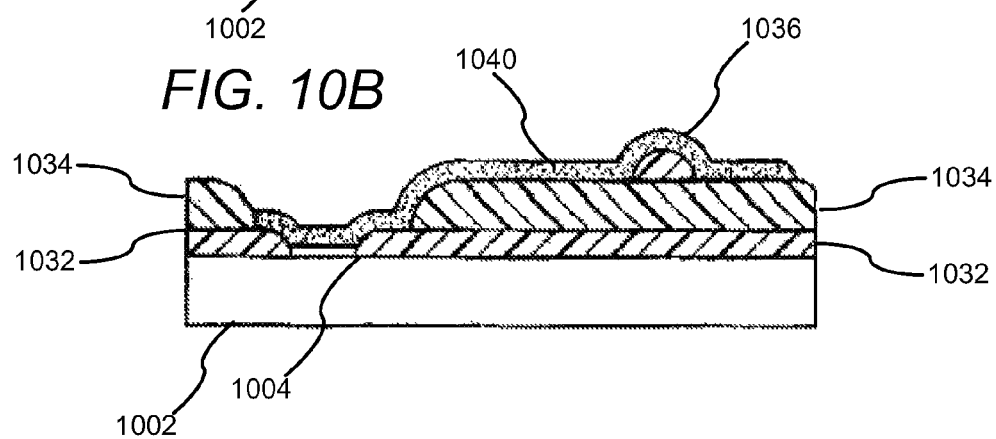
Figure 10C:
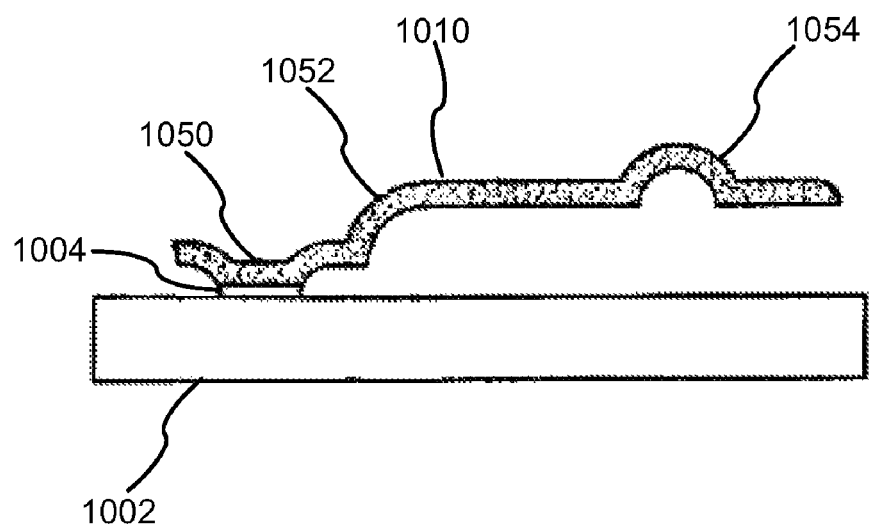

The shapes and configurations of contact springs formed lithographically are almost limitless. FIGS. 10A-10C and 11 illustrate nonexclusive examples of such shapes and configurations. In FIG. 10A, a plurality of masking layers 1032, 1034, 1036 define a spring shape at an input/output terminal 1004. As shown in FIGS. 10B and 10C, depositing a spring material or materials 1040 on the masking layers and then removing the masking layers forms a spring 1010 having a base portion 1050 secured to the input/output terminal 1004, a beam portion 1052, and a contact portion 1054.

Figure 11:
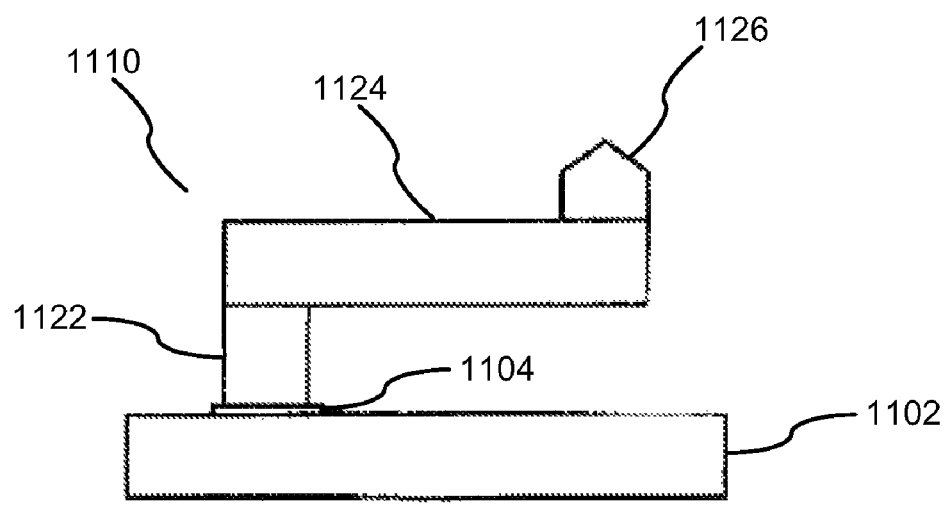

FIG. 11 illustrates an example of a multi-part lithographically formed spring contact 1110 in which distinct post 1122, beam 1124, and tip 1126 portions are created. Typically, the post 1122 is created by forming a first masking layer (not shown) over a substrate 1102 with an opening over an input/output terminal 1104 defining post 1122. The opening is then filled, forming the post 1122. Thereafter, a second masking layer (not shown) is formed over the first masking layer, defining an opening that includes the post 1122 and defines the beam 1124. The beam 1124 is then created by filling the opening with a material. The process is then repeated with a third masking layer (not shown) defining the tip 1126.

It should be noted that, rather than form springs on the substrate, springs may be formed separately from the substrate and, once formed, attached to the substrate. Further descriptions of lithographically formed spring contacts may be found in commonly-assigned U.S. patent application Ser. No. 09/032,473, filed Feb. 26, 1998 (PCT publication WO 9852224), U.S. patent application Ser. No. 09/205,023, filed Dec. 2, 1998, and U.S. Pat. No. 6,255,126, all three of which are incorporated by reference herein in their entirety.

These spring contacts are illustrative examples of compliant interconnection elements and not intended to limit the present invention. Any interconnection element including, but not limited to, compliant interconnection elements may be used to couple one or more dies within a cooled package in a probe card cooling assembly according to the present invention.

8. ADDITIONAL EMBODIMENTS

Figure 12:
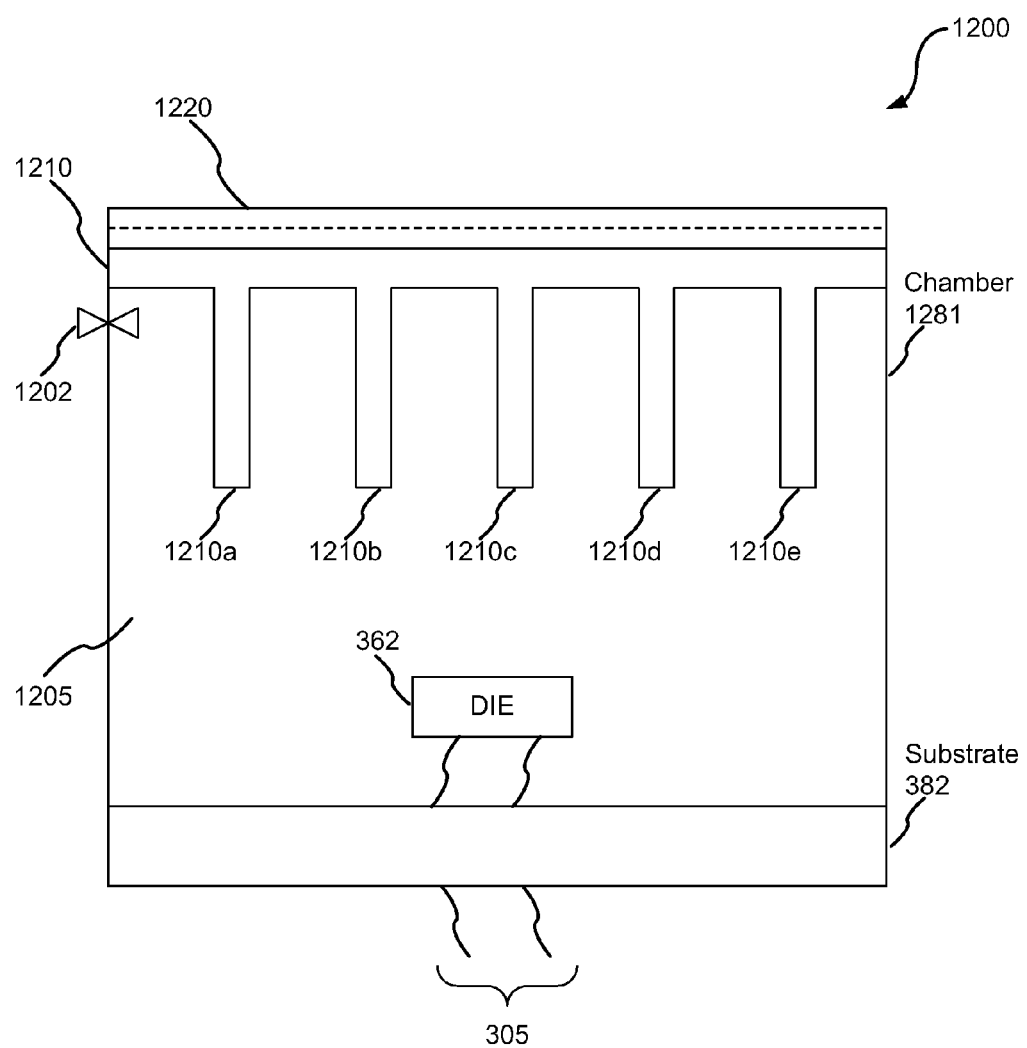
FIG. 12 is a diagram of a probe card cooling assembly according to a further embodiment of the present invention.

Further, as shown in FIG. 12, in another embodiment of the present invention, a probe card cooling assembly 1200 includes a cooling member 1220 and a cooled package with one or more heat radiators 1210 such as cooling fins 1210a-1210e. The cooled package includes a chamber 1281 that encloses a cavity 1205. Liquid or gas coolant is added through a valve 1202 to fill cavity 1205 and immerse one or more dies 362 on substrate 382. During operation, die(s) 362 are directly cooled by surrounding coolant. Heat is transferred away from the coolant by the one or more heat radiators 1210 to the cooling member 1220. Cooling member 1220 includes a liquid or gas coolant that circulates through cooling member 1220 to further remove heat.

Probe card cooling assemblies according to the present invention are not limited to cooling dies in an active probe head. A cooling assembly as described herein can also be put on an interposer and/or printed circuit board within a probe card assembly. For example, a probe card cooling assembly according to the present invention can also include one or more cooled packages that house an interposer, printed circuit board, and/or dies. A cooling system 314 and coolant circulation system 312 can then directly cool the interposer, printed circuit board, and/or dies.

9. CONCLUSION

The previous description of the preferred embodiments is provided to enable any person skilled in the art to make or use the present invention. While the invention has been particularly shown and described with reference to preferred embodiments thereof, it will be understood by those skilled in the art that various changes in form and details may be made therein without departing from the spirit and scope of the invention.

What is claimed is:

1. A probe card assembly component comprising:
   a cooling package comprising an enclosed cavity and external electrical connections disposed outside of the cavity;
   a plurality of spring probe elements electrically and mechanically disposed outside of the cavity and coupled to an outer surface of the cooling package, the spring probe elements configured to make pressure-based electrical connections with terminals of an electronic device to be tested;
   a test die disposed in the cavity and electrically connected to the external electrical connections and the probe elements, the test die comprising active circuitry for testing the electronic device to be tested; and
   an entrance port through which a coolant for cooling the die enters the cavity.

2. The probe assembly component of claim 1 further comprising a wiring board coupled to the cooling package and configured to connect to a tester for controlling testing of the electronic device to be tested, wherein the external electrical connections are connected to the wiring board.

3. The probe card assembly component of claim 2 further comprising an interposer disposed between the cooling package and the wiring board and electrically connecting the external electrical connections to the wiring board.

4. The probe card assembly component of claim 3 further comprising:
an exit port through which the coolant exits the cavity; and
a circulation system configured to circulate coolant through the cavity.

5. The probe card assembly component of claim 4, wherein the test die is immersed in the coolant.

6. The probe card assembly component of claim 4, wherein the circulation system circulates the coolant along an active surface of the test die.

7. The probe card assembly component of claim 1, wherein the cooling package further comprises:
a first substrate, wherein the outer surface of the cooling package to which the probe elements are coupled comprises a first surface of the first substrate;
a second substrate disposed adjacent to but spaced apart from the first substrate; and
at least one seal disposed between the first substrate and the second substrate, wherein the cavity is between the first substrate, the second substrate, and the at least one seal.

8. The probe card assembly component of claim 7, wherein the test die is physically connected to a second surface of the first substrate, which is opposite the first surface.

9. The probe card assembly component of claim 8, wherein the test die and the probe elements are electrically connected to the external electrical connections through the first substrate.

10. The probe card assembly component of claim 8, wherein:
the external electrical connections are disposed on the second substrate, and
the test die and the probe elements are electrically connected to the external electrical connections through the second substrate.

11. The probe card assembly component of claim 10 further comprising electrical connections within the cavity electrically connecting the first substrate and the second substrate.

12. The probe card assembly component of claim 1 further comprising:
an exit port through which the coolant exits the cavity; and
a circulation system configured to circulate coolant through the cavity.

13. The probe card assembly component of claim 12, wherein the test die is immersed in the coolant.

14. The probe card assembly component of claim 12, wherein the circulation system circulates the coolant along an active surface of the test die.

15. The probe card assembly component of claim 14 further comprising alignment posts coupled to an interior surface of the cavity, the test die disposed between the alignment posts, the alignment posts configured to hold by frictional contact the test die in place against the circulation of the coolant.

16. The probe card assembly component of claim 15 further comprising complaint interconnection structures disposed within the cavity and configured to hold the test die between the alignment posts.

* * * * *